United States Patent
Ockenfuss

(10) Patent No.: US 11,041,982 B2
(45) Date of Patent: Jun. 22, 2021

(54) SILICON-GERMANIUM BASED OPTICAL FILTER

(71) Applicant: VIAVI Solutions Inc., San Jose, CA (US)

(72) Inventor: Georg J. Ockenfuss, Santa Rosa, CA (US)

(73) Assignee: VIAVI Solutions Inc., San Jose, CA (US)

(*) Notice: Subject to any disclaimer, the term of this patent is extended or adjusted under 35 U.S.C. 154(b) by 217 days.

(21) Appl. No.: 16/228,184

(22) Filed: Dec. 20, 2018

(65) Prior Publication Data

US 2019/0146131 A1    May 16, 2019

Related U.S. Application Data

(63) Continuation of application No. 15/365,540, filed on Nov. 30, 2016, now Pat. No. 10,168,459.

(51) Int. Cl.
*G02B 5/20* (2006.01)
*G02B 5/28* (2006.01)
(Continued)

(52) U.S. Cl.
CPC .............. *G02B 5/207* (2013.01); *C23C 14/06* (2013.01); *C23C 14/14* (2013.01); *C23C 14/352* (2013.01);
(Continued)

(58) Field of Classification Search
CPC .......... G02B 5/20; G02B 5/207; G02B 5/208; G02B 5/26; G02B 5/28; G02B 5/281;
(Continued)

(56) References Cited

U.S. PATENT DOCUMENTS

| 4,747,666 | A | * | 5/1988 | Ishida | G02B 5/281 |
| | | | | | 359/588 |
| 5,140,464 | A | * | 8/1992 | Kyogoku | G02B 5/285 |
| | | | | | 355/71 |

(Continued)

FOREIGN PATENT DOCUMENTS

| CN | 102208473 B | 6/2014 |
| DE | 10 2004 013851 | 10/2005 |

(Continued)

OTHER PUBLICATIONS

Extended European Search Report corresponding to EP 17 20 4222, dated Mar. 14, 2018, 8 pages.

(Continued)

*Primary Examiner* — Arnel C Lavarias
(74) *Attorney, Agent, or Firm* — Harrity & Harrity, LLP

(57) ABSTRACT

An optical filter may include a substrate. An optical filter may include a set of optical filter layers disposed onto the substrate. The set of optical filter layers including a first subset of optical filter layers. The first subset of optical filter layers may include a silicon-germanium (SiGe) with a first refractive index. An optical filter may include a second subset of optical filter layers. The second subset of optical filter layers may include a material with a second refractive index. The second refractive index being less than the first refractive index.

20 Claims, 14 Drawing Sheets

(51) Int. Cl.
*C23C 14/06* (2006.01)
*C23C 14/35* (2006.01)
*C23C 14/58* (2006.01)
*C23C 14/14* (2006.01)

(52) U.S. Cl.
CPC .......... *C23C 14/5806* (2013.01); *G02B 5/281* (2013.01); *G02B 5/285* (2013.01)

(58) Field of Classification Search
CPC ........ G02B 5/282; G02B 5/285; G02B 5/286; G02B 5/287; G02B 5/288; G02B 5/289
USPC ....... 359/350, 352, 355, 356, 359, 360, 577, 359/580, 581, 582, 584, 586, 588, 589, 359/590
See application file for complete search history.

(56) References Cited

U.S. PATENT DOCUMENTS

| | | | | |
|---|---|---|---|---|
| 5,296,961 | A | * | 3/1994 | Trost ...................... G02B 5/282 359/359 |
| 5,426,532 | A | | 6/1995 | Costich |
| 5,726,798 | A | | 3/1998 | Bushman |
| 5,999,321 | A | * | 12/1999 | Bradley ............... G02B 27/283 348/E5.141 |
| 8,085,351 | B2 | | 12/2011 | Takahashi |
| 9,354,369 | B2 | | 5/2016 | Hendrix et al. |
| 10,168,459 | B2 | | 1/2019 | Ockenfuss |
| 2004/0095661 | A1 | | 5/2004 | Chidichimo |
| 2014/0091419 | A1 | | 4/2014 | Hasegawa et al. |
| 2014/0111423 | A1 | | 4/2014 | Park et al. |
| 2016/0238759 | A1 | | 8/2016 | Sprague et al. |

FOREIGN PATENT DOCUMENTS

| | | |
|---|---|---|
| JP | 03210503 A | 9/1991 |
| JP | 05313013 A | 11/1993 |
| JP | H09 15571 | 1/1997 |
| JP | 2000503614 A | 3/2000 |
| JP | 2005501286 A | 1/2005 |
| JP | 2006053200 A | 2/2006 |
| JP | 2012079975 A | 4/2012 |
| KR | 20150031336 A | 3/2015 |
| WO | WO 2006017640 A1 | 2/2006 |
| WO | WO 2015/155356 | 10/2015 |

OTHER PUBLICATIONS

International Search Report and Written Opinion for Application No. PCT/US2017/063115, dated Mar. 12, 2018, 9 pages.

* cited by examiner

| substrate / wafer dimension | | deflection | |
|---|---|---|---|
| size [mm] | thickness [mm] | Si:H design [mm] | SiGe:H design [mm] |
| 200 | 0.7 | 3.29 | 2.07 |
| 200 | 0.5 | 4.05 | 2.54 |
| 200 | 0.2 | 25 | 15.85 |
| 200 | 0.15 | 45 | 28.18 |
| 300 | 0.7 | 4.65 | 2.91 |
| 300 | 0.5 | 9.11 | 5.7 |

FIG. 5C

SILICON-GERMANIUM BASED OPTICAL FILTER

RELATED APPLICATION

This application is a continuation of U.S. patent application Ser. No. 15/365,540, filed Nov. 30, 2016 (now U.S. Pat. No. 10,168,459), which is incorporated herein by reference.

BACKGROUND

An optical transmitter may emit light that is directed toward an object. For example, in a gesture recognition system, the optical transmitter may transmit near infrared (NIR) light toward a user, and the NIR light may be reflected off the user toward an optical receiver. In this case, the optical receiver may capture information regarding the NIR light, and the information may be used to identify a gesture being performed by the user. For example, a device may use the information to generate a three dimensional representation of the user, and to identify the gesture being performed by the user based on the three dimensional representation.

In another example, information regarding the NIR light may be used to recognize an identity of the user, a characteristic of the user (e.g., a height or a weight), a characteristic of another type of target (e.g., a distance to an object, a size of the object, or a shape of the object), or the like. However, during transmission of the NIR light toward the user and/or during reflection from the user toward the optical receiver, ambient light may interfere with the NIR light. Thus, the optical receiver may be optically coupled to an optical filter, such as a bandpass filter, to filter ambient light and to allow NIR light to pass through toward the optical receiver.

SUMMARY

According to some implementations, an optical filter may include a substrate. An optical filter may include a set of optical filter layers disposed onto the substrate. The set of optical filter layers including a first subset of optical filter layers. The first subset of optical filter layers may include a silicon-germanium (SiGe) with a first refractive index. An optical filter may include a second subset of optical filter layers. The second subset of optical filter layers may include a material with a second refractive index. The second refractive index being less than the first refractive index.

According to some implementations, an optical filter may include a substrate. An optical filter may include a high refractive index material layer and a low refractive index material layer disposed onto the substrate to filter incident light. Wherein a first portion of the incident light with a first spectral range is to be reflected by the optical filter and a second portion of the incident light with a second spectral range is to be passed through by the optical filter. The high refractive index material layers being hydrogenated silicon-germanium (SiGe:H). The low refractive index material layers being silicon dioxide (SiO$_2$).

According to some implementations, an optical system may include an optical transmitter to emit near-infrared (NIR) light. An optical system may include an optical filter to filter an input optical signal and provide the filtered input optical signal. The input optical signal including the NIR light from the optical transmitter and ambient light from an optical source. The optical filter including a set of dielectric thin film layers. The set of dielectric thin film layers including a first subset of layers of silicon-germanium with a first refractive index. A second subset of layers of a material with a second refractive index less than the first refractive index, the filtered input optical signal including a reduced intensity of ambient light relative to the input optical signal. An optical system may include an optical receiver to receive the filtered input optical signal and provide an output electrical signal.

BRIEF DESCRIPTION OF THE DRAWINGS

FIG. 5C is a diagram of another example of mechanical characteristics for a set of materials relating to an example implementation described herein.

DETAILED DESCRIPTION

Figure 1A:
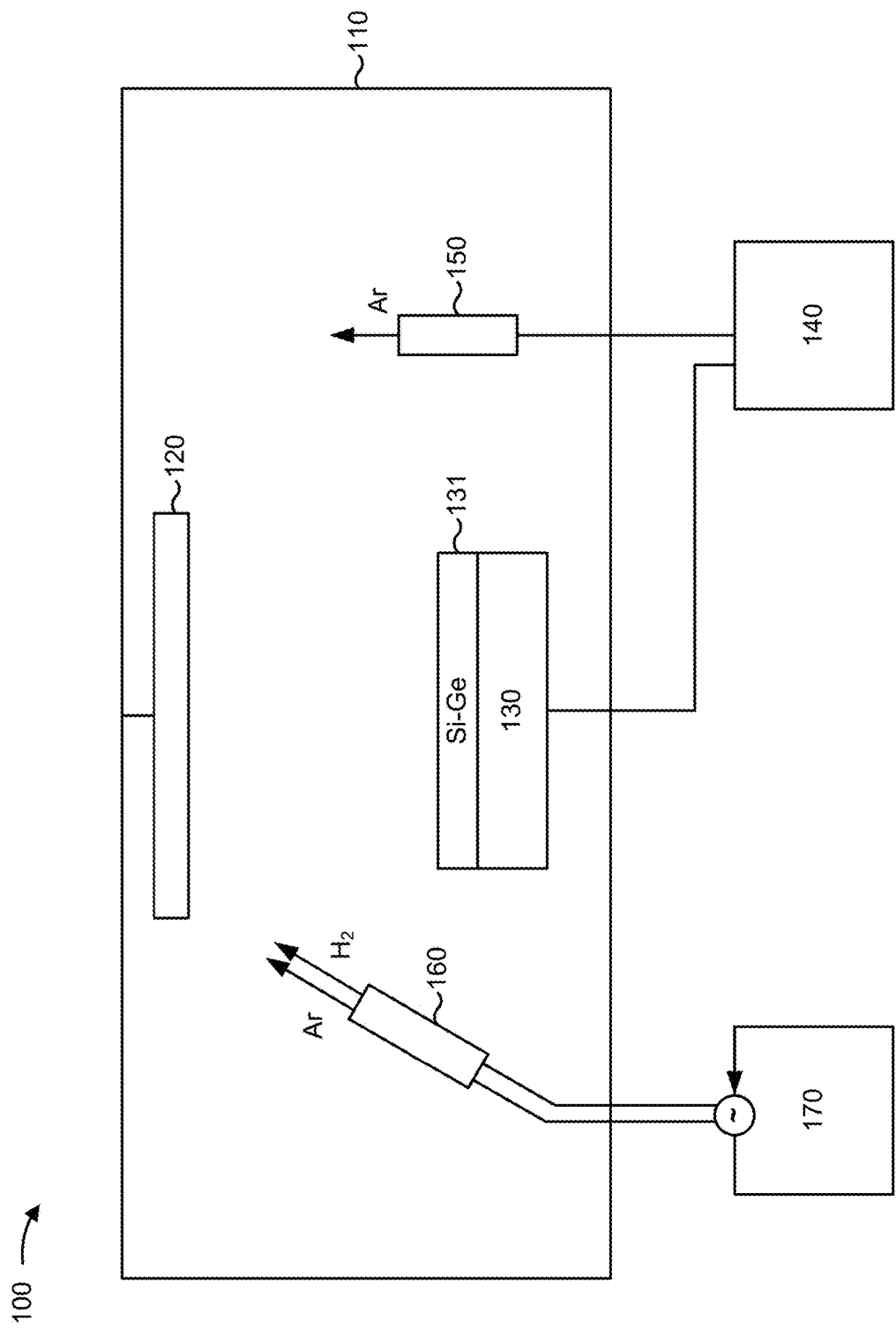
FIGS. 1A-1D are diagrams of an overview of an example implementation described herein.

The following detailed description of example implementations refers to the accompanying drawings. The same reference numbers in different drawings may identify the same or similar elements.

An optical receiver may receive light from an optical source, such as an optical transmitter. For example, the optical receiver may receive near infrared (NIR) light from the optical transmitter and reflected off a target, such as a user or an object. In this case, the optical receiver may receive the NIR light as well as ambient light, such as visible spectrum light. The ambient light may include light from one or more light sources separate from the optical transmitter, such as sunlight, light from a light bulb, or the like. The ambient light may reduce an accuracy of a determination relating to the NIR light. For example, in a gesture recognition system, the ambient light may reduce an accuracy of generation of a three-dimensional image of the target based on the NIR light. Thus, the optical receiver may be optically coupled to an optical filter, such as a bandpass filter, to filter ambient light and to pass through NIR light toward the optical receiver.

The optical filter may include a set of dielectric thin film layers. The set of dielectric thin film layers are selected and deposited to block a portion of out-of-band light below a particular threshold, such as 700 nanometers (nm), and pass light for a particular range of wavelengths, such as a range of approximately 700 nm to approximately 1700 nm, a range of approximately 800 nm to approximately 1100 nm, a range of approximately 900 nm to approximately 1000 nm, a range of approximately 920 nm to approximately 980 nm, or the like. For example, the set of dielectric thin film layers may be selected to filter out the ambient light. Additionally, or alternatively, the set of dielectric film layers may be selected to block out-of-band light below the particular threshold, and to pass light for another range of wavelengths, such as a range of approximately 1500 nm to approximately 1600 nm, a range of approximately 1520 nm to approximately 1580 nm, or at a wavelength of approximately 1550 nm.

Implementations, described, herein, may utilize a silicon-germanium (SiGe) based material, such as hydrogenated silicon-germanium (SiGe:H) material or the like, as a set of high index layers for an optical filter, such as low angle shift optical filter. In this way, based on having a higher effective refractive index relative to another filter stack that uses another high index layer material, the optical filter may provide a relatively low angle-shift. Moreover, a filter using the SiGe or SiGe:H material may substantially block or effectively screen out ambient light and pass through NIR light. The wavelength shift at a particular angle of incidence may be calculated as:

$$\lambda_{shift}(\Theta) = \lambda_0 \left(1 - \frac{\sqrt{n_{eff}^e - (\sin\Theta)^2}}{n_{eff}}\right);$$

where $\lambda_{shift}$ represents a wavelength shift at a particular angle of incidence, $\Theta$ represents the particular angle of incidence, $n_{eff}$ represents the effective refractive index, and $\lambda_0$ represents the wavelength of light at $\Theta=0°$.

FIGS. 1A-1D are diagram of an example 100 of a set of geometries for sputter deposition systems for manufacturing example implementations described herein.

As shown in FIG. 1, example 100 includes a vacuum chamber 110, a substrate 120, a cathode 130, a target 131, a cathode power supply 140, an anode 150, a plasma activation source (PAS) 160, and a PAS power supply 170. Target 131 may include a silicon-germanium material in a particular concentration selected based on optical characteristics of the particular concentration, as described herein. In another example, an angle of cathode 130 may be configured to cause a particular concentration of silicon-germanium to be sputtered onto substrate 120, as described herein. PAS power supply may be utilized to power PAS 160 and may include a radio frequency (RF) power supply. Cathode power supply 140 may be utilized to power cathode 130 and may include a pulsed direct current (DC) power supply.

With regard to FIG. 1A, target 131 is sputtered in the presence of hydrogen ($H_2$), as well as an inert gas, such as argon, to deposit a hydrogenated silicon-germanium material as a layer on substrate 120. The inert gas may be provided into the chamber via anode 150 and/or PAS 160. Hydrogen is introduced into the vacuum chamber 110 through PAS 160, which serves to activate the hydrogen. Additionally, or alternatively, cathode 130 (e.g., in this case, hydrogen may be introduced from another part vacuum chamber 110) or anode 150 may cause hydrogen activation (e.g., in this case, hydrogen may be introduced into vacuum chamber 110 by anode 150). In some implementations, the hydrogen may take the form of hydrogen gas, a mixture of hydrogen gas and a noble gas (e.g., argon gas), or the like. PAS 160 may be located within a threshold proximity of cathode 130, allowing plasma from PAS 160 and plasma from cathode 130 to overlap. The use of the PAS 160 allows the hydrogenated silicon layer to be deposited at a relatively high deposition rate. In some implementations, the hydrogenated silicon-germanium layer is deposited at a deposition rate of approximately 0.05 nm/s to approximately 2.0 nm/s, at a deposition rate of approximately 0.5 nm/s to approximately 1.2 nm/s, at a deposition rate of approximately 0.8 nm/s, or the like.

Although the sputtering procedure is described, herein, in terms of a particular geometry and a particular implementation, other geometries and other implementations are possible. For example, hydrogen may be injected from another direction, from a gas manifold in a threshold proximity to cathode 130, or the like.

Figure 1B:
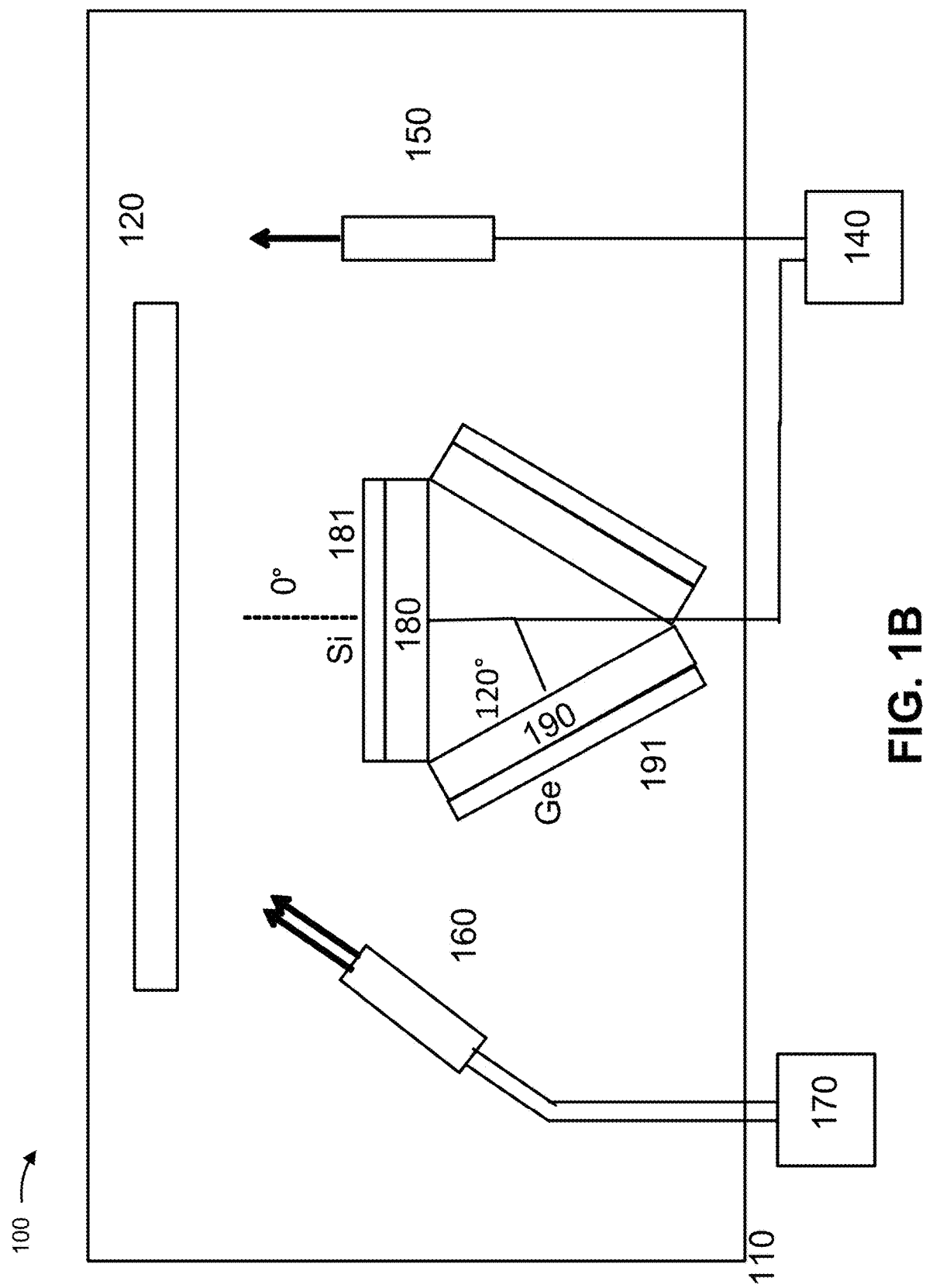
Figure 1C:
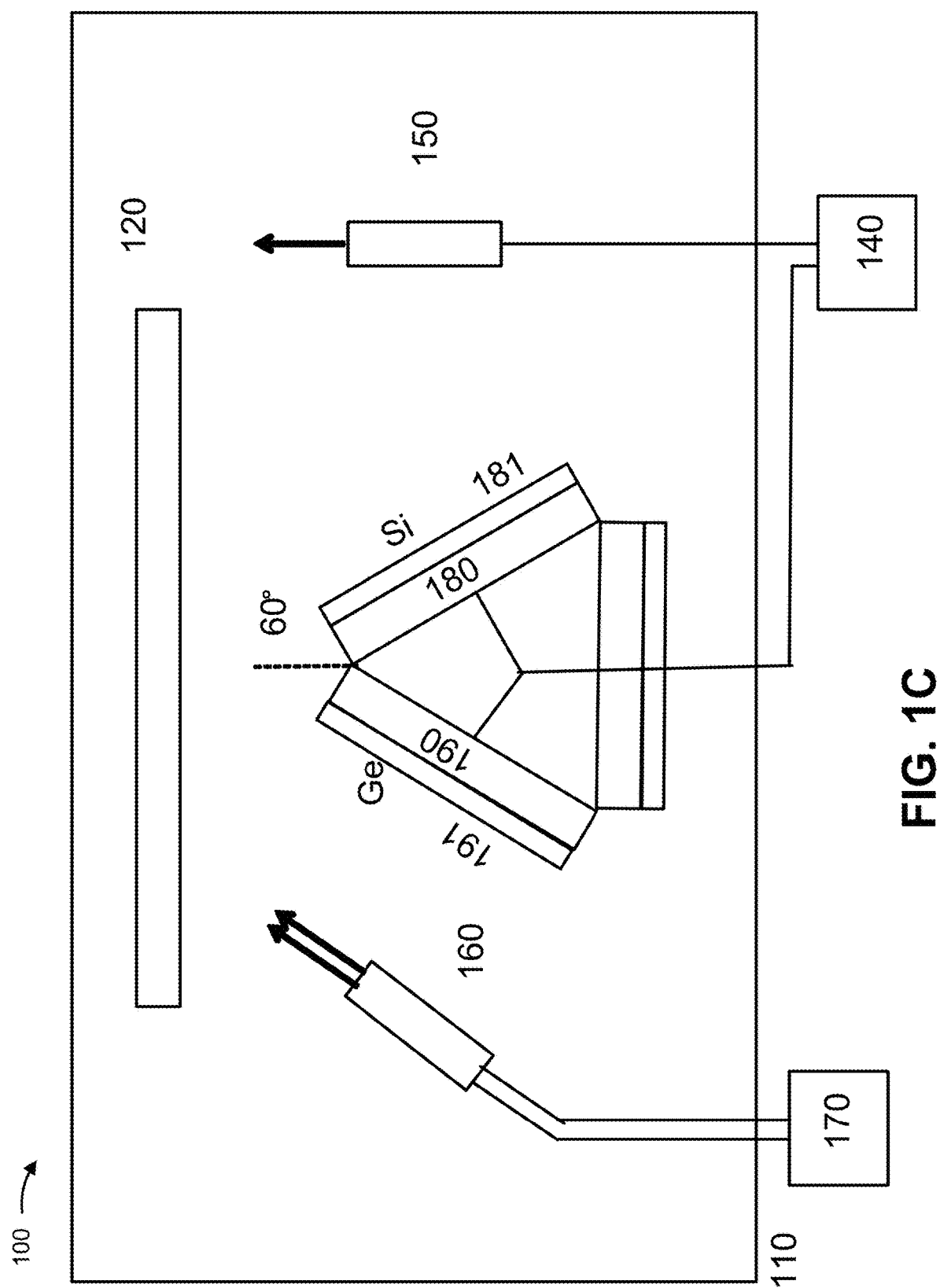

As shown in FIGS. 1B-1C, a similar sputter deposition system includes a vacuum chamber 110, a substrate 120, a first cathode 180, a second cathode 190, a silicon target 181, a germanium target 191, a cathode power supply 140, an anode 150, a plasma activation source (PAS) 160, and a PAS power supply 170. In this case, silicon target 181 is a silicon target and germanium target 191 is a germanium target.

As shown in FIG. 1B, silicon target 181 is oriented at approximately 0 degrees relative to substrate 120 (e.g., approximately parallel to substrate 120) and germanium target 191 is oriented at approximately 120 degrees relative to substrate 120. In this case, silicon and germanium are sputtered by cathode 180 and cathode 190, respectively from silicon target 181 and germanium target 191, respectively, onto substrate 120.

As shown in FIG. 1C, in a similar sputter deposition system, silicon target 181 and germanium target 191 are each oriented at approximately 60 degrees relative to substrate 120, and silicon and germanium are sputtered by cathode 180 and cathode 190, respectively, from first target 181 and second target 191, respectively, onto substrate 120.

Figure 1D:
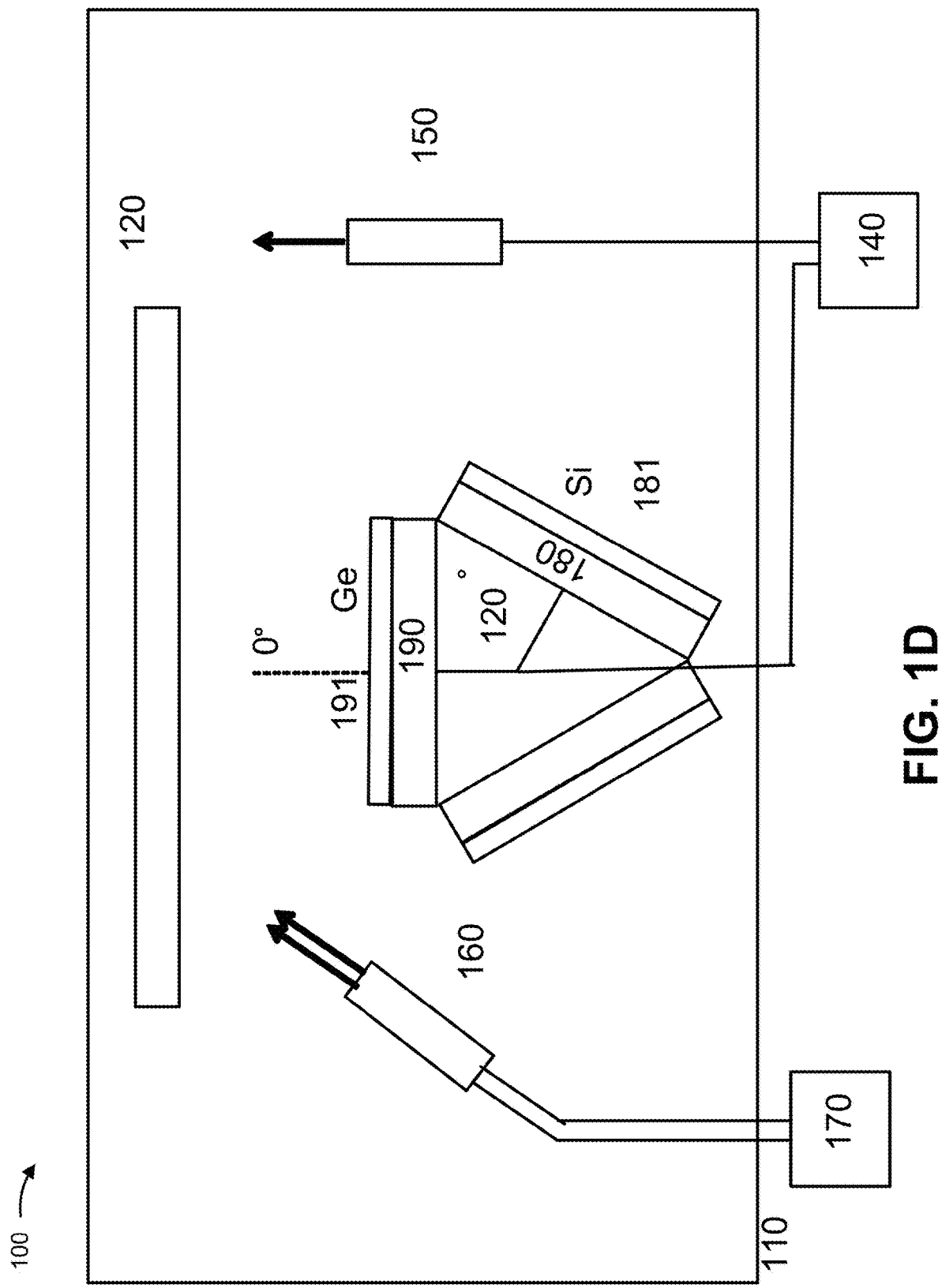

As shown in FIG. 1D, in a similar sputter deposition system, silicon target 181 is oriented at approximately 120 degrees relative to substrate 120 and germanium target 191 is oriented at approximately 0 degrees relative to substrate 120. In this case, silicon and germanium are sputtered by cathode 180 and cathode 190, respectively from silicon target 181 and germanium target 191, respectively, onto substrate 120.

With regard to FIGS. 1A-1D, each configuration of components in a silicon sputter deposition system may result in a different relative concentration of silicon and germanium. Although, described, herein, in terms of different configurations of components, different relative concentrations of silicon and germanium may also be achieved using different materials, different manufacturing processes, or the like.

As indicated above, FIGS. 1A-1D are provided merely as an example. Other examples are possible and may differ from what was described with regard to FIGS. 1A-1D.

Figure 2A:
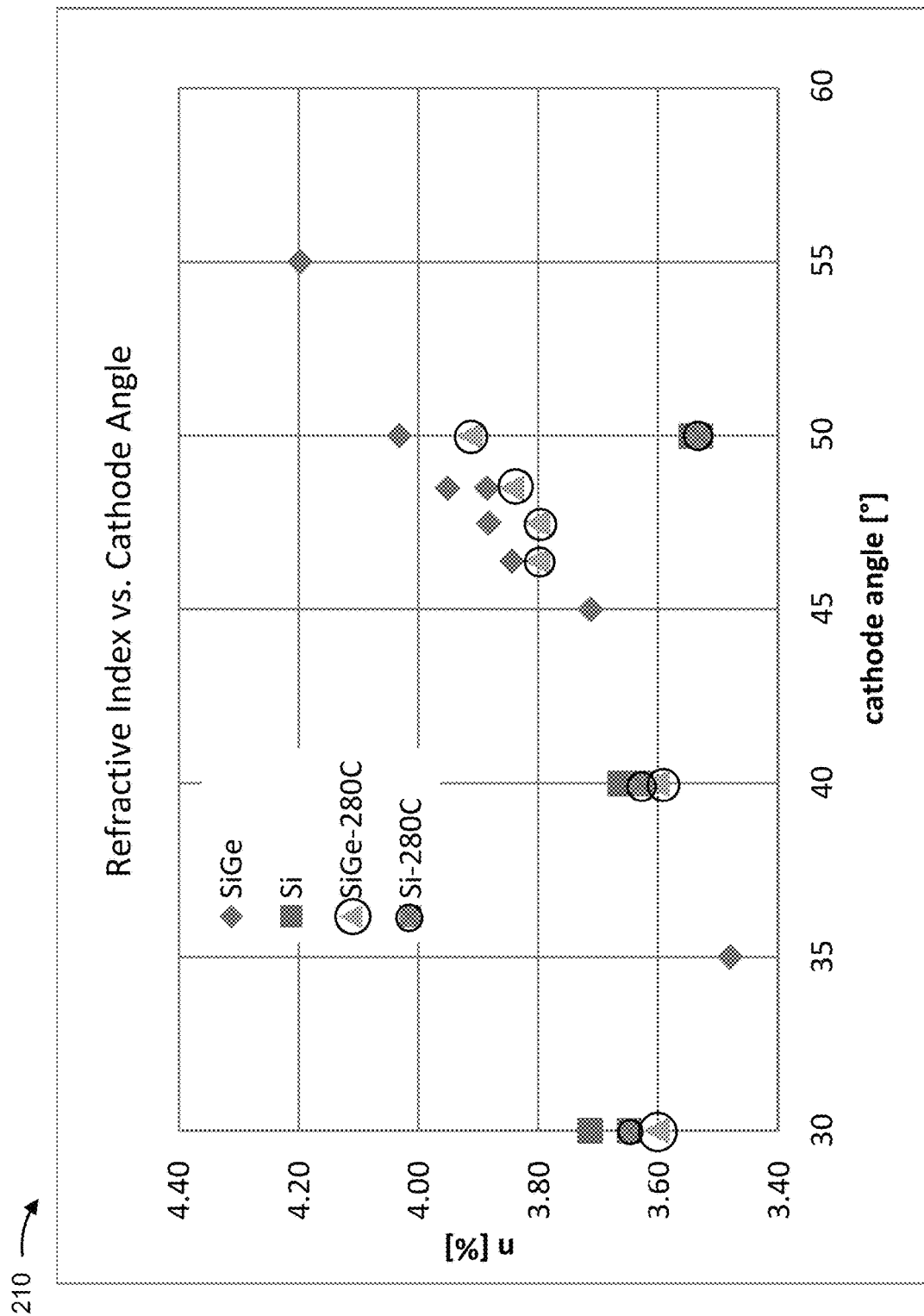
FIGS. 2A and 2B are diagrams of an example of optical characteristics for a set of materials relating to an example implementation described herein.
Figure 2B:
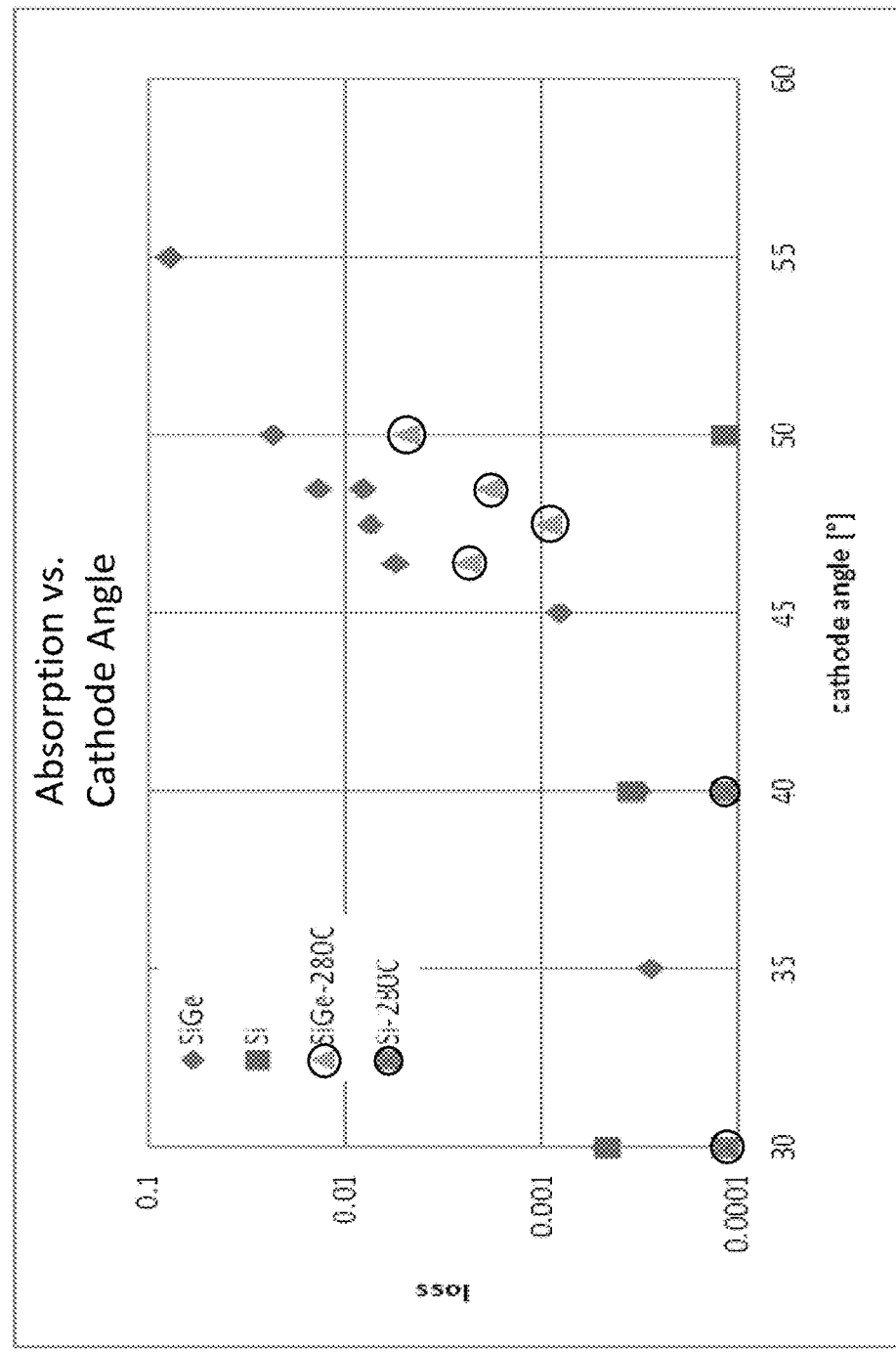

FIGS. 2A and 2B are diagrams of an example of characteristics relating to using an example implementation described herein.

As shown in FIG. 2A, and by chart 210, a set of characteristics are determined, for example, for a SiGe layer (e.g., a SiGe:H layer for use in an optical filter). Assume that an increase in cathode angle of a cathode sputtering silicon corresponds to an increased germanium content in the optical filter relative to a silicon content, as described in further detail with regard to FIGS. 1B-1D. For example, for high index layers of an optical filter, deposited at 30 degrees, the high index layer may be associated with an approximately 7.5% germanium content. Similarly, for deposition at 35 degrees the optical filter may be associated with an approximately 22% germanium content, and for deposition at 50 degrees the optical filter may be associated with an approximately 90% germanium content.

As further shown in FIG. 2A, and by chart 210, a refractive index n at a wavelength of 950 nm is provided for a set of layers based on a cathode angle (in degrees) at which sputtering was performed to sputter material to form the set of high index material single layers. As shown, for a silicon-germanium (SiGe) and annealed silicon-germanium (SiGe-280C) (e.g., silicon-germanium for which an annealing procedure has been performed at 280 degrees Celsius (C)) based high index single layer or SiGe single layers, an increase in cathode angle corresponds to an increase in refractive index. Moreover, the refractive index for silicon layers including germanium is greater than for silicon not including germanium, such as a silicon (Si) based optical filter and an annealed silicon (Si-280C) based optical filter, thereby improving performance of an optical filter that includes SiGe layers.

As shown in FIG. 2B, and by chart 220, another set of optical characteristics are determined for the SiGe single layers. As shown, an absorption at a wavelength of 950 nm of the set of SiGe single layers is determined in relation to a type of material for the high index layers and a cathode angle used for a sputtering procedure to deposit the high index layers. For example, increased germanium content (e.g., increased cathode angle) is associated with increased absorption loss in the SiGe layer. However, annealed silicon-germanium is associated with a reduced absorption loss for an optical filter associated with a similar cathode angle relative to non-annealed silicon-germanium. For example, annealed silicon-germanium may be associated with a loss value that satisfies an absorption threshold for utilization in optical filters at a cathode angle that corresponds to a refractive index that satisfies a refractive index threshold for utilization in low angle shift for an optical filter. In this way, annealing silicon-germanium (or hydrogenated silicon-germanium) may permit silicon-germanium (or hydrogenated silicon-germanium) to be used as a low-angle shift coating with a relatively high refractive index and without an excessive absorption of NIR light.

As indicated above, FIGS. 2A and 2B are provided merely as examples. Other examples are possible and may differ from what was described with regard to FIGS. 2A and 2B.

Figure 3A:
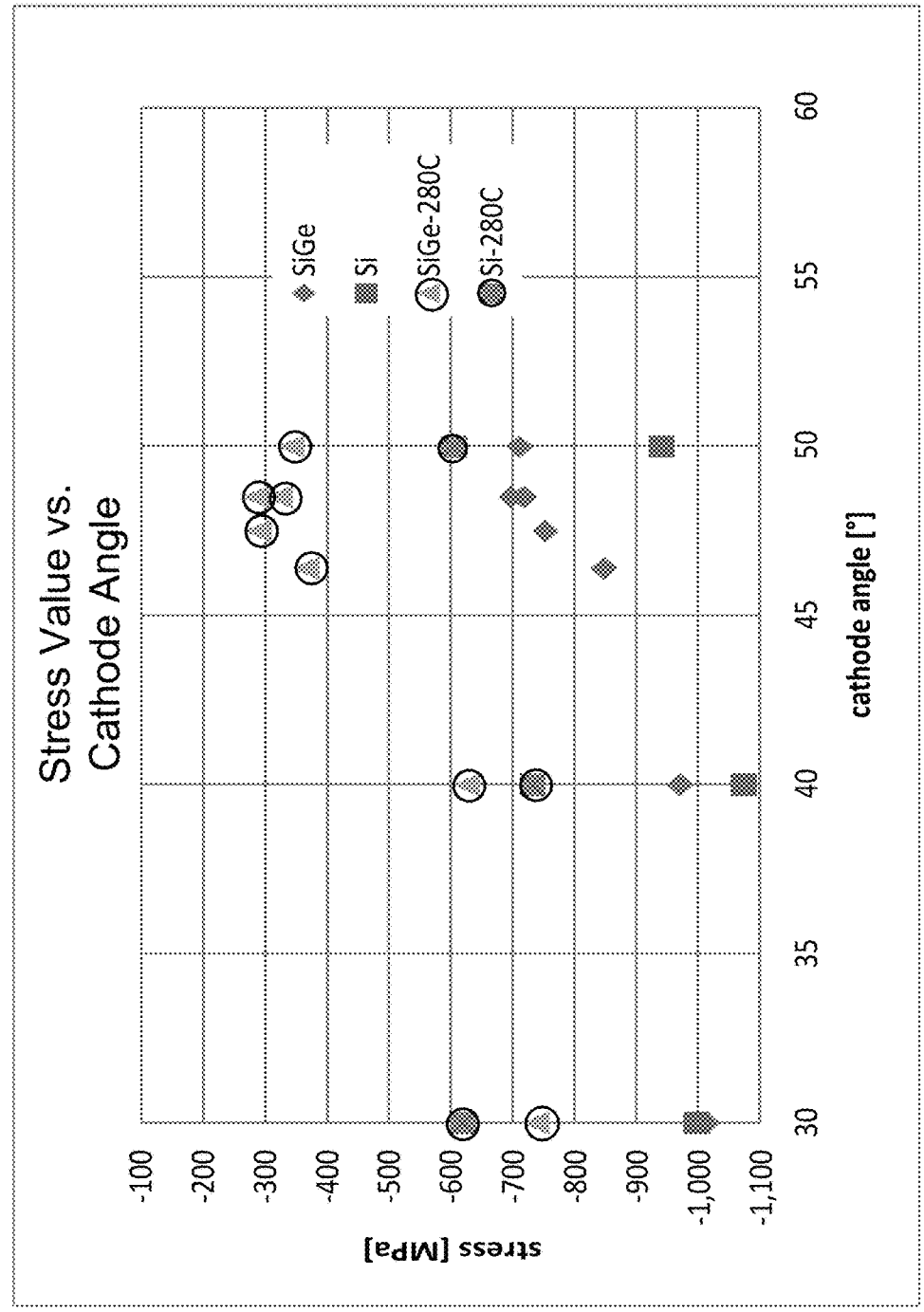
FIG. 3A is a diagram of an example of mechanical characteristics for a set of materials relating to an implementation described herein.
Figure 3B:
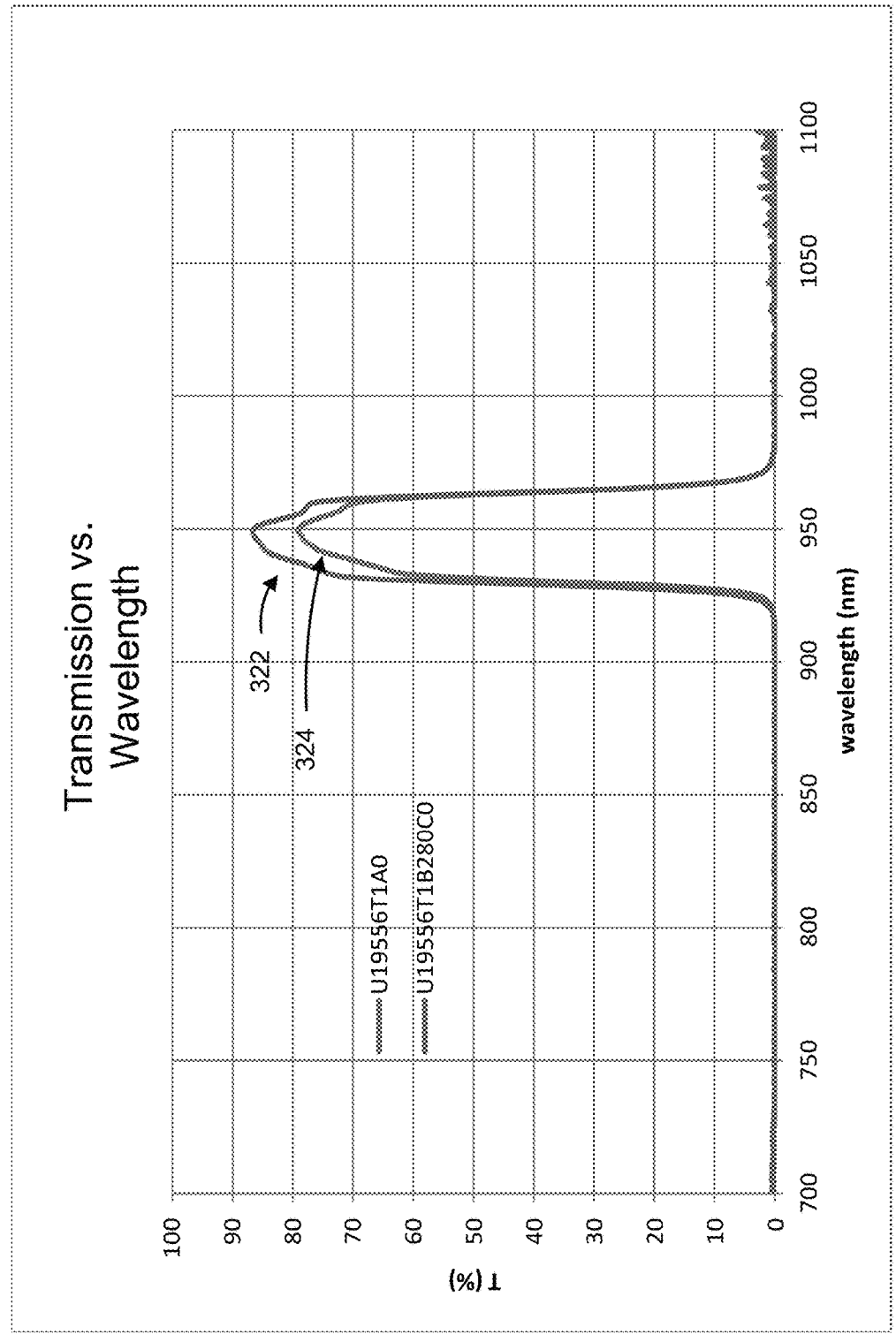
FIG. 3B is a diagram of another example of optical characteristics for a set of materials relating to an example implementation described herein.

FIGS. 3A and 3B are diagrams of another example of characteristics relating to using an example implementation described herein.

As shown in FIG. 3A, and by chart 310, a set of mechanical characteristics are determined for the set of SiGe single layers. As shown, a stress value (in megapascals (MPa)) of the set of SiGe single layers is determined in relation to a type of material for the high index layers and a cathode angle used for a sputtering procedure to deposit the high index layers. The stress value may be a compressive stress on the SiGe single layer as a result of the sputtering procedure. For example, increased germanium content (e.g., increased cathode angle) is associated with decreased stress for a SiGe single layer. As shown, annealed silicon-germanium is associated with a reduced stress value for a SiGe single layer associated with a similar cathode angle to non-annealed silicon-germanium. For example, annealed silicon-germanium may be associated with a stress value that satisfies a stress threshold for utilization in optical filters at a cathode angle that corresponds to a refractive index that satisfies a refractive index threshold for utilization in optical filters. Reduced stress value may reduce a difficulty in manufacture when the manufacturing procedure includes cutting a wafer into multiple portions for multiple optical filters. Moreover, a reduced stress value may permit a reduced thickness substrate relative to another type of material with a greater stress value. In this way, annealing silicon-germanium (or hydrogenated silicon-germanium) may permit silicon-germanium (or hydrogenated silicon-germanium) to be used as a low-angle shift coating with a relatively high refractive index and without an excessive stress value, thereby improving manufacturability of an optical filter and reducing a thickness of the optical filter relative to a non-annealed optical filter and especially if compared of filters just using silicon or hydrogenated silicon.

As shown in FIG. 3B, and by chart 320, a set of optical characteristics are determined for a set of bandpass filters center at 950 nm. As shown, a transmissivity percentage of a first optical filter and a second optical filter is determined in relation to a utilization of annealing and a wavelength of light. Assume that a first optical filter, corresponding to reference number 322, and a second optical filter, corresponding to reference number 324, are each associated with a set of 4 cavities, a 3.1 micrometer thickness, a silicon-germanium set of high index layers, a silicon dioxide set of low index layers, no anti-reflective coating on the second side, and a cathode angle of 47.5 degrees (e.g., which may correspond to approximately 80% germanium for the set of high index layers).

With regard to FIG. 3B, and reference numbers 322 and 324, utilization of annealing improves transmissivity at approximately 950 nm by approximately 7% (e.g., to greater than 80% or approximately 85% at approximately 950 nm) relative to not utilizing annealing of an optical filter. In this way, annealing silicon-germanium (or hydrogenated silicon-germanium) may permit silicon-germanium (or hydrogenated silicon-germanium) to be used as a low-angle shift coating with improved transmissivity relative to a non-annealed optical filter. In another example, including an anti-reflective coating (e.g., on a backside surface of the optical filter) may improve transmissivity by an additional approximately 5% relative to the first optical filter without an anti-reflective coating.

Although FIG. 3B shows an example relating to a particular set of characteristics of the first optical filter and the second optical filter, other examples described herein may exhibit similarly improved performance with annealing for other characteristics of an optical filter.

Although FIG. 3B shows an example relating to optical characteristics of a bandpass filter, similarly improved optical characteristics may be associated with manufacture of a shortwave pass filter, a long wave pass filter, an anti-reflective coating, a non-polarizing beam splitter, a polarizing beam splitter, a dielectric reflector, a multi-bandpass filter, a notch filter, a multi-notch filter, a neutral density filter, or the like.

As indicated above, FIGS. 3A and 3B are provided merely as examples. Other examples are possible and may differ from what was described with regard to FIGS. 3A and 3B.

Figure 4:
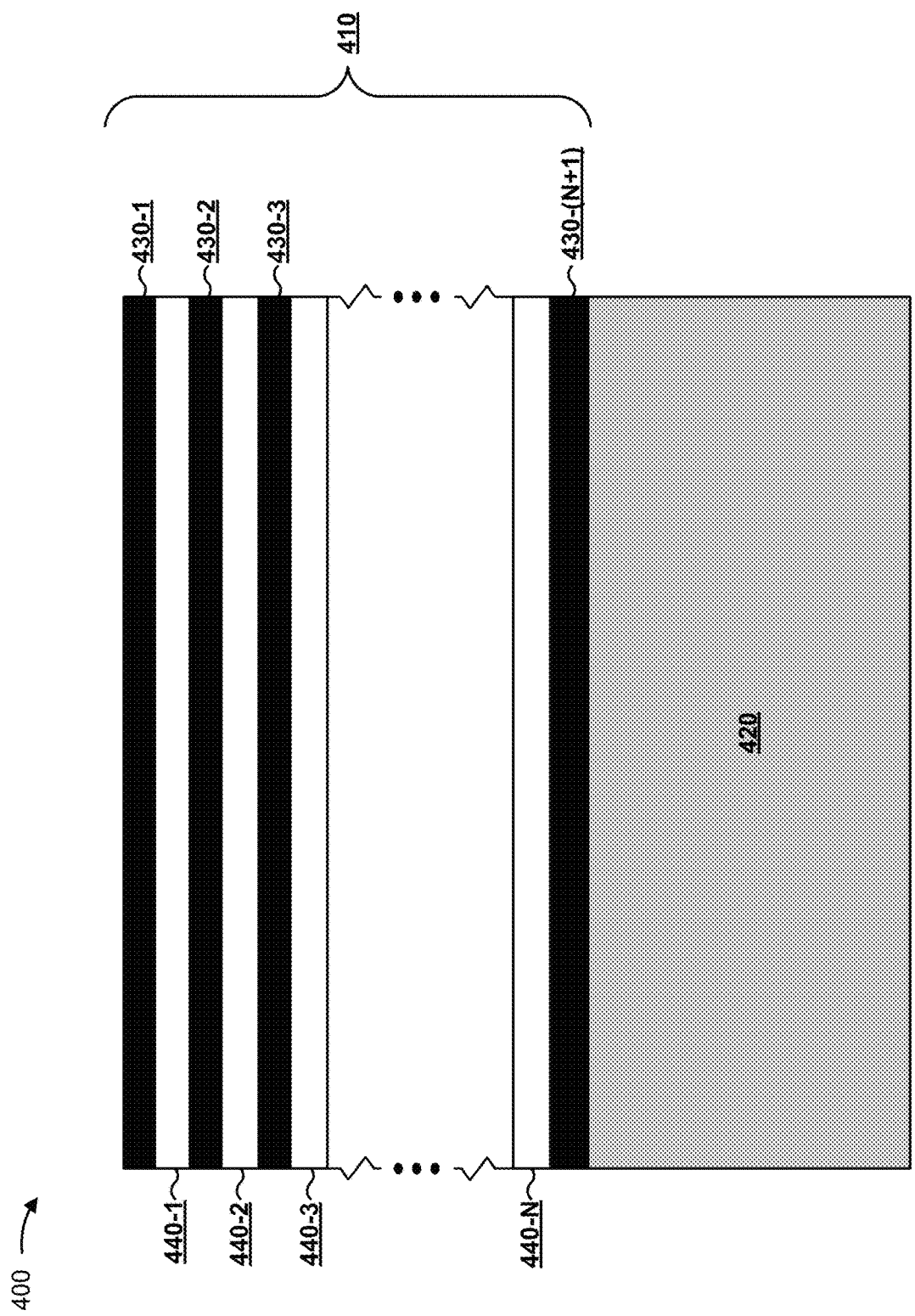
FIG. 4 is a diagram of an example implementation described herein.

FIG. 4 is a diagram of an example optical filter 400. FIG. 4 shows an example stackup of an optical filter using a silicon-germanium based material as a high index material. As further shown in FIG. 4, optical filter 400 includes an optical filter coating portion 410 and a substrate 420.

Optical filter coating portion 410 includes a set of optical filter layers. For example, optical filter coating portion 410 includes a first set of layers 430-1 through 430-N+1 (N≥1) and a second set of layers 440-1 through 440-N. Layers 430 may include a set of layers of a high refractive index material (H layers), such as silicon-germanium, hydrogenated silicon-germanium layers, or the like. The SiGe layers may include (small quantities of) phosphorous, boron, nitride, or the like. Layers 440 may include a set of layers of a low refractive index material (L layers), such as silicon dioxide layers or the like. Additionally, or alternatively, the L layers may include silicon nitride layers, Ta2O5 layers, Nb2O5 layers, TiO2 layers, Al2O3 layers, ZrO2 layers, Y2O3 layers, Si3N4 layers, a combination thereof, or the like.

In some implementations, layers 430 and 440 may be stacked in a particular order, such as an $(H-L)_m$ ($m \geq 1$) order, an $(H-L)_m$-H order, an L-$(H-L)_m$ order, or the like. For example, as shown, layers 430 and 440 are positioned in an $(H-L)_n$-H order with an H layer disposed at a surface of optical filter 400 and an H layer disposed at a surface of substrate 420. In some implementations, optical filter coating portion 410 may be associated with a particular quantity of layers, m. For example, a hydrogenated silicon-germanium based optical filter may include a quantity of alternating H layers and L layers, such as a range of 2 layers to 200 layers.

In some implementations, each layer of optical filter coating portion 410 may be associated with a particular thickness. For example, layers 430 and 440 may each be associated with a thickness of between 1 nm and 1500 nm, 3 nm and 1000 nm, 600 nm and 1000 nm, or 10 nm and 500 nm, and/or optical filter coating portion 410 may be associated with a thickness of between 0.1 μm and 100 μm, 0.25 μm and 100 μm, or the like. In some examples, at least one of layers 430 and 440 may be associated with a thickness of less than 1000 nm, less than 600 nm, less than 100 nm, or less than 5 nm, and/or optical filter coating portion 410 may be associated with a thickness of less than 100 μm, less than 50 μm, and/or less than 10 μm. In some implementations, layers 430 and 440 may be associated with multiple thicknesses, such as a first thickness for layers 430 and a second thickness for layers 440, a first thickness for a first subset of layers 430 and a second thickness for a second subset of layers 430, a first thickness for a first subset of layers 440 and a second thickness for a second subset of layers 440, or the like. In this case, a layer thickness and/or a quantity of layers may be selected based on an intended set of optical characteristics, such as an intended passband, an intended reflectance, or the like.

In some implementations, a particular silicon-germanium based material may be selected for the layers 430. For example, layers 430 may be selected and/or manufactured (e.g., via a sputtering procedure) to include a particular type of silicon-germanium, such as SiGe-50, SiGe-40, SiGe-60, or the like. In some implementations, layers 430 may include trace amounts of another material, such as argon, as a result of a sputter deposition procedure, as described herein. In another example, the particular silicon-germanium based material may be manufactured using a hydrogenating procedure to hydrogenate the silicon-germanium based material, a nitrogenating procedure to nitrogenate the silicon-germanium based material, one or more annealing procedures to anneal the silicon-germanium based material, another type of procedure, a doping procedure (e.g., phosphorous based doping, nitrogen based doping, boron based doping, or the like) to dope the silicon-germanium based material, or a combination of multiple procedures (e.g., a combination of hydrogenation, nitrogenation, annealing, and/or doping), as described herein. For example, layers 430 may be selected to include a refractive index greater than that of layers 440 over, for example, a spectral range of approximately 800 nm to approximately 1100 nm, a spectral range of approximately 900 nm to approximately 1000 nm, a particular wavelength of approximately 950 nm, or the like. In another example, layers 430 may be selected to include a refractive index greater than that of layers 440 over, for example, a spectral range of approximately 1400 nm to approximately 1700 nm, a spectral range of approximately 1500 nm to approximately 1600 nm, a particular wavelength of approximately 1550 nm, or the like. In this case, layers 430 may be associated with a refractive index greater than 3, a refractive index greater than 3.5, a refractive index greater than 3.8, or a refractive index greater than 4. For example, layers 430 may be associated with a refractive index greater than 4 at approximately 954 nm.

In some implementations, a particular material may be selected for layers 440. For example, layers 440 may include a set of silicon dioxide ($SiO_2$) layers, a set of aluminum oxide ($Al_2O_3$) layers, a set of titanium dioxide ($TiO_2$) layers, a set of niobium pentoxide ($Nb_2O_5$) layers, a set of tantalum pentoxide ($Ta_2O_5$) layers, a set of magnesium fluoride ($MgF_2$) layers, a set of silicon nitride ($S_3N_4$) layers, zirconium oxide ($ZrOz_2$), yttrium oxide ($Y_2O_3$), or the like. In this case, layers 440 may be selected to include a refractive index lower than that of the layers 430 over, for example, a spectral range of approximately 800 nm to approximately 1100 nm, the spectral range of approximately 900 nm to approximately 1000 nm, the wavelength of approximately 954 nm, or the like. For example, layers 440 may be selected to be associated with a refractive index of less than 3 over the spectral range of approximately 800 nm to approximately 1100 nm. In another example, layers 440 may be selected to be associated with a refractive index of less than 2.5 over the spectral range of approximately 800 nm to approximately 1100 nm, the spectral range of approximately 900 nm to approximately 1000 nm, the wavelength of approximately 954 nm, or the like. In another example, layers 440 may be selected to be associated with a refractive index of less than 2 over the spectral range of approximately 800 nm to approximately 1100 nm, the spectral range of approximately 900 nm to approximately 1000 nm, the wavelength of approximately 954 nm, or the like. In some implementations, layers 430 and/or 440 may be associated with a particular extinction coefficient, such as an extinction coefficient of below approximately 0.007, an extinction coefficient of below approximately 0.003, an extinction coefficient of below approximately 0.001, or the like over a particular spectral ranges (e.g., the spectral range of approximately 800 nm to approximately 1100 nm, the spectral range of approximately 900 nm to approximately 1000 nm, the wavelength of approximately 954 nm, or the like; and/or a spectral range of approximately 1400 nm to approximately 1700 nm, a spectral range of approximately 1500 nm to approximately 1600 nm, a particular wavelength of approximately 1550 nm, or the like). In some implementations, the particular material may be selected for layers 440 based on a desired width of an out-of-band blocking spectral range, a desired center-wavelength shift associated with a change of angle of incidence (AOI), or the like.

In some implementations, optical filter coating portion 410 may be fabricated using a sputtering procedure. For example, optical filter coating portion 410 may be fabricated using a pulsed-magnetron based sputtering procedure to sputter alternating layers 430 and 440 on a glass substrate or another type of substrate. In some implementations, multiple cathodes may be used for the sputtering procedure, such as a first cathode to sputter silicon and a second cathode to sputter germanium. In this case, the multiple cathodes may be associated with an angle of tilt of the first cathode relative to the second cathode selected to ensure a particular concentration of germanium relative to silicon. In some implementations, hydrogen flow may be added during the sputtering procedure to hydrogenate the silicon-germanium. Similarly, nitrogen flow may be added during the sputtering procedure to nitrogenate the silicon-germanium. In some implementations, optical filter coating portion 410 may be annealed using one or more annealing procedures, such as a first annealing procedure at a temperature of approximately 280 degrees Celsius or between approximately 200 degrees Celsius and approximately 400 degrees Celsius, a second annealing procedure at a temperature of approximately 320 degrees Celsius or between approximately 250 degrees Celsius and approximately 350 degrees Celsius, or the like. In some implementations, optical filter coating portion 410 may be fabricated using a SiGe:H coated from a target, as described with regard to FIGS. 1A-1D. For example, a SiGe compound target with a selected ratio of silicon to germanium may be sputtered to fabricate optical filter coating portion 410 with a particular silicon to germanium ratio.

In some implementations, optical filter coating portion 410 may be associated with causing a reduced angle shift relative to an angle shift caused by another type of optical filter. For example, based on a refractive index of the H layers relative to a refractive index of the L layers, optical filter coating portion 410 may cause a reduced angle shift relative to another type of optical filter with another type of high index material.

In some implementations, optical filter coating portion 410 is attached to a substrate, such as substrate 420. For example, optical filter coating portion 410 may be attached to a glass substrate or another type of substrate. Additionally, or alternatively, optical filter coating portion 410 may be coated directly onto a detector or onto a set of silicon wafers including an array of detectors (e.g., using photo-lithography, a lift-off process, etc.). In some implementations, optical filter coating portion 410 may be associated with an incident medium. For example, optical filter coating portion 410 may be associated with an air medium or a glass medium as an incident medium. In some implementations, optical filter 400 may be disposed between a set of prisms. In another example, another incident medium may be used, such as a transparent epoxy, and/or another substrate may be used, such as a polymer substrate (e.g., a polycarbonate substrate, a cyclic olefin copolymer (COP) substrate, or the like).

As indicated above, FIG. 4 is provided merely as an example. Other examples are possible and may differ from what was described with regard to FIG. 4.

Figure 5A:
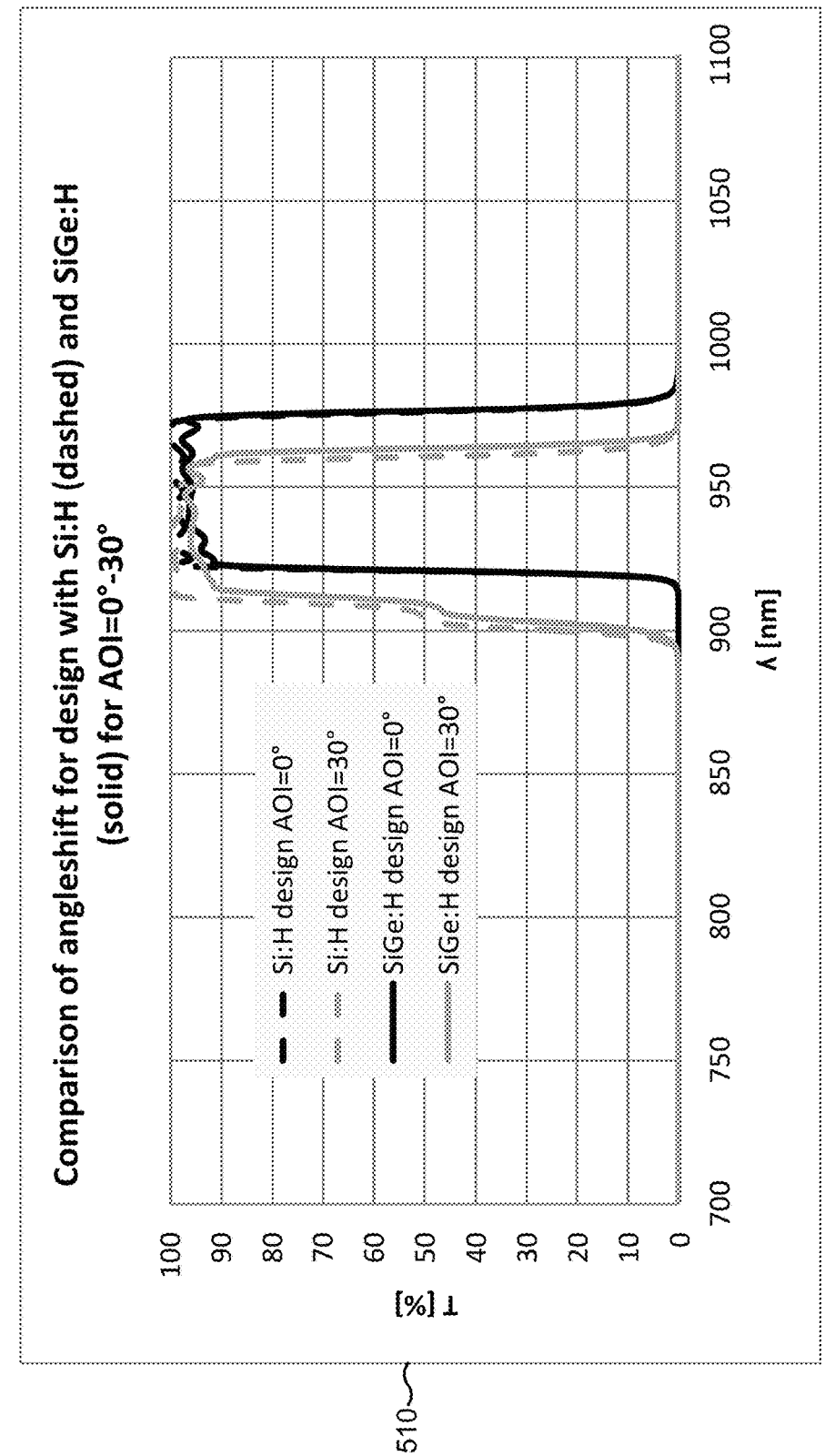
FIGS. 5A and 5B are diagrams of another example of optical characteristics for a set of materials relating to an example implementation described herein.
Figure 5B:
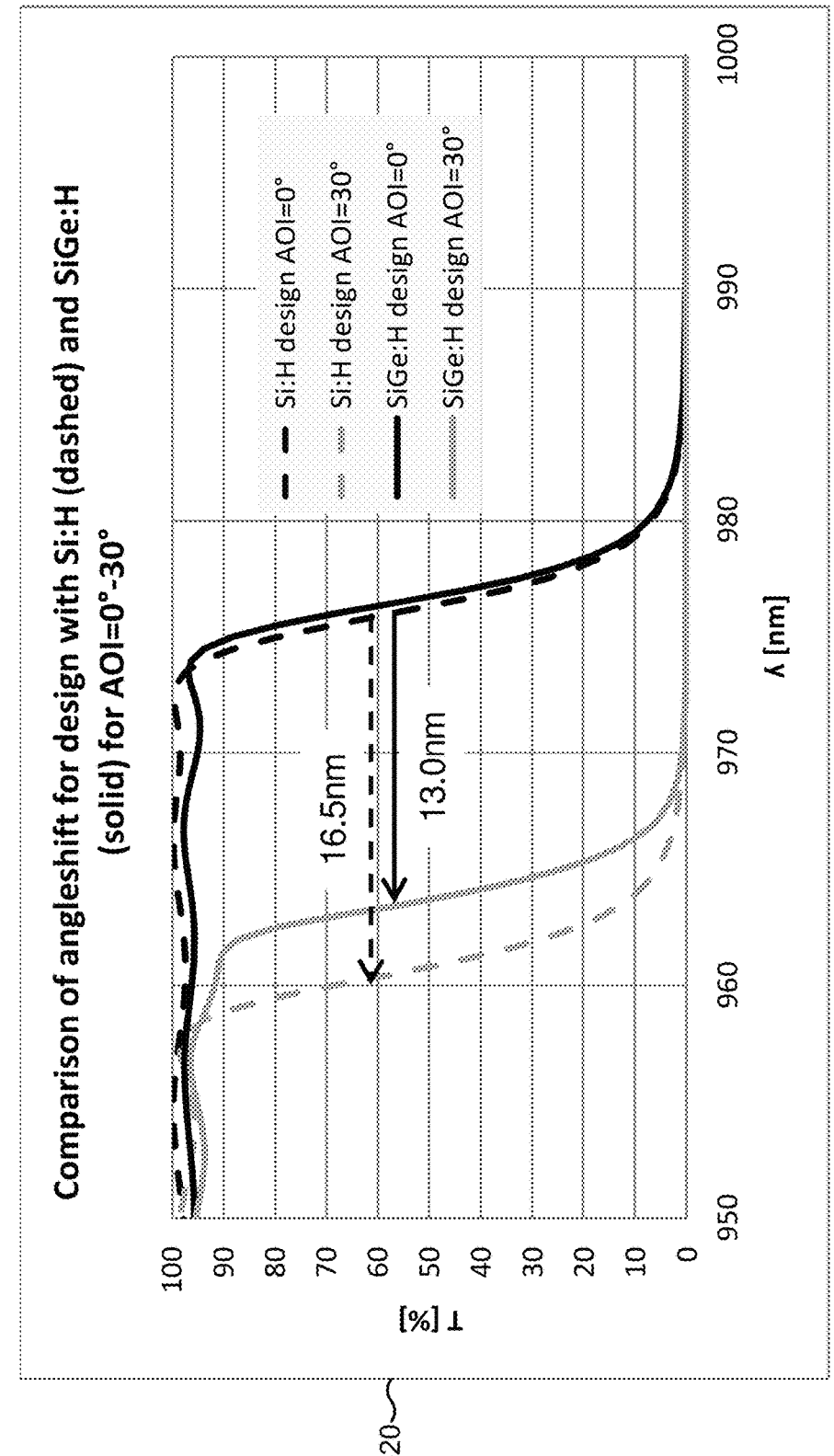

FIGS. 5A-5C are diagrams of another example of characteristics relating to using an example implementation described herein.

As shown in FIG. 5A, and by chart 510, a set of optical characteristics of a set of optical filters (e.g., a hydrogenated silicon (Si:H) based optical filter and a hydrogenated silicon-germanium (SiGe:H) based optical filter). In this case, the set of optical filters may utilize silicon dioxide as a low index material. As shown, a transmission percentage at a set of wavelengths is determined for the set of optical filters. In this case, the SiGe:H optical filter is associated with a refractive index of 3.871 at 950 nm and the Si:H optical filter is associated with a refractive index of 3.740 at 950 nm. As a result of the SiGe:H optical filter having a higher refractive index than the Si:H optical filter, the SiGe:H optical filter may be associated with a reduced physical thickness. For example, the Si:H optical filter may be associated with a 6.3 micrometer thickness and the SiGe:H optical filter may be associated with a 5.4 micrometer thickness. Additionally, the SiGe:H optical filter may be associated with a greater blocking efficiency (e.g., the SiGe:H optical filter may be more absorbing at approximately 700 nm than the Si:H optical filter resulting in a reduced quarter wave stack coating to block a wavelength range including 700 nm).

As shown in FIG. 5B, chart 520 shows a portion of chart 510 at a wavelength range of 950 nanometers to 1000 nanometers. As shown in chart 520, the angleshift is shown to be 16.5 nm for the Si:H optical filter at an angle of incidence (AOI) from 0 degrees to 30 degrees and 13.0 nm for the SiGe:H optical filter at an angle of incidence from 0 degrees to 30 degrees. In this case, the SiGe:H optical filter is shown to have a reduced angle shift relative to the Si:H optical filter resulting in improved optical performance.

As shown in FIG. 5C, and by chart 530, a design of Si:H optical filters and SiGe:H optical filters, such as the optical filters of FIGS. 5A and 5B and a set of optical characteristics are shown. As shown the set of optical filters are associated with a substrate size of 200 mm to 300 mm and a substrate thickness of 0.15 mm to 0.7 mm. For each wafer size and wafer thickness, the SiGe:H optical filter is associated with a reduced substrate deflection relative to the Si:H optical filter. In this way, durability and manufacturability of an optical filter is improved. Moreover, based on reducing a stress value, a substrate size may be increased for a similar substrate thickness relative to other substrate designs, based on reducing a likelihood of braking during a singulation procedure relative to other substrate designs with higher stress values.

As indicated above, FIGS. 5A-5C are provided merely as examples. Other examples are possible and may differ from what was described with regard to FIGS. 5A-5C.

Figure 6A:
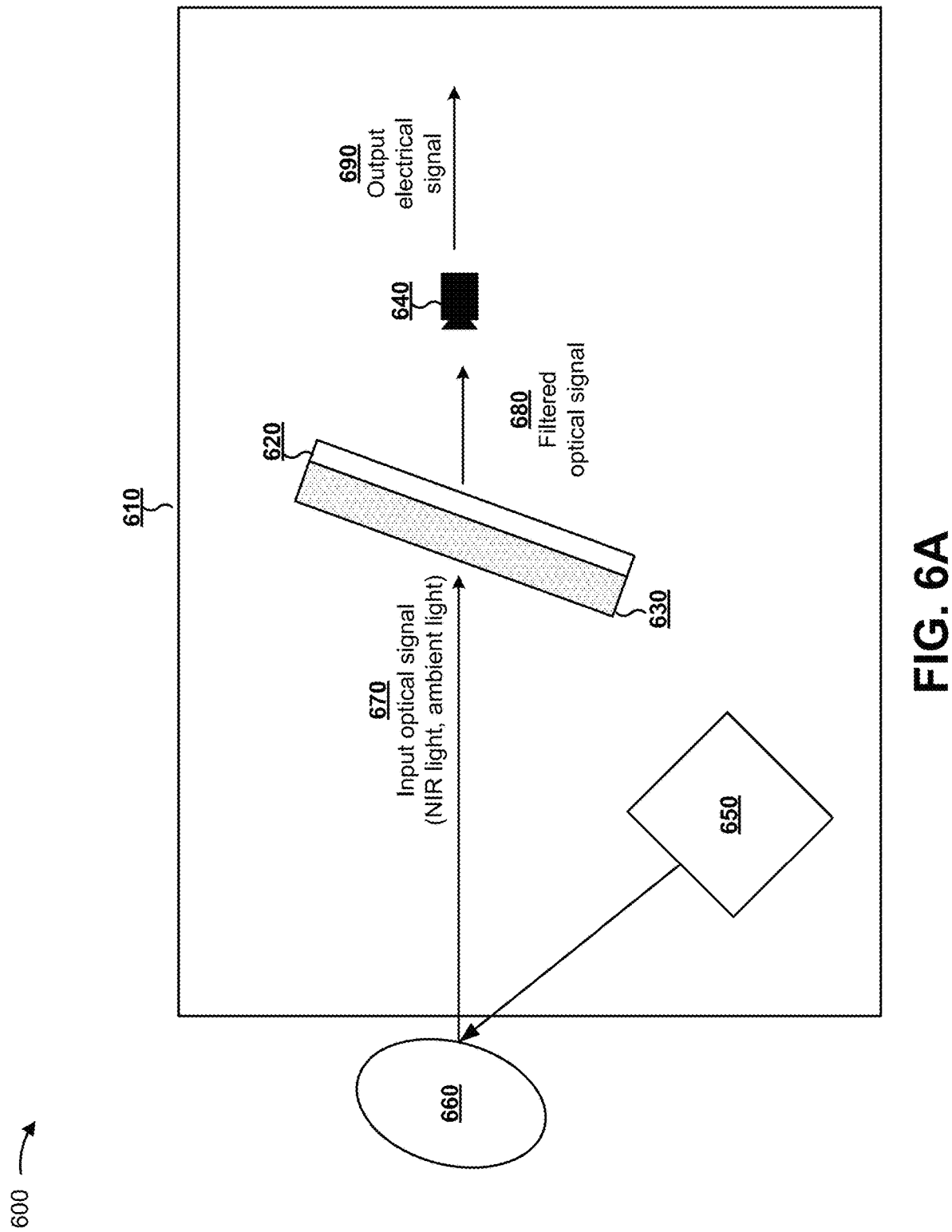
FIGS. 6A and 6B are diagrams of another example implementation described herein.
Figure 6B:
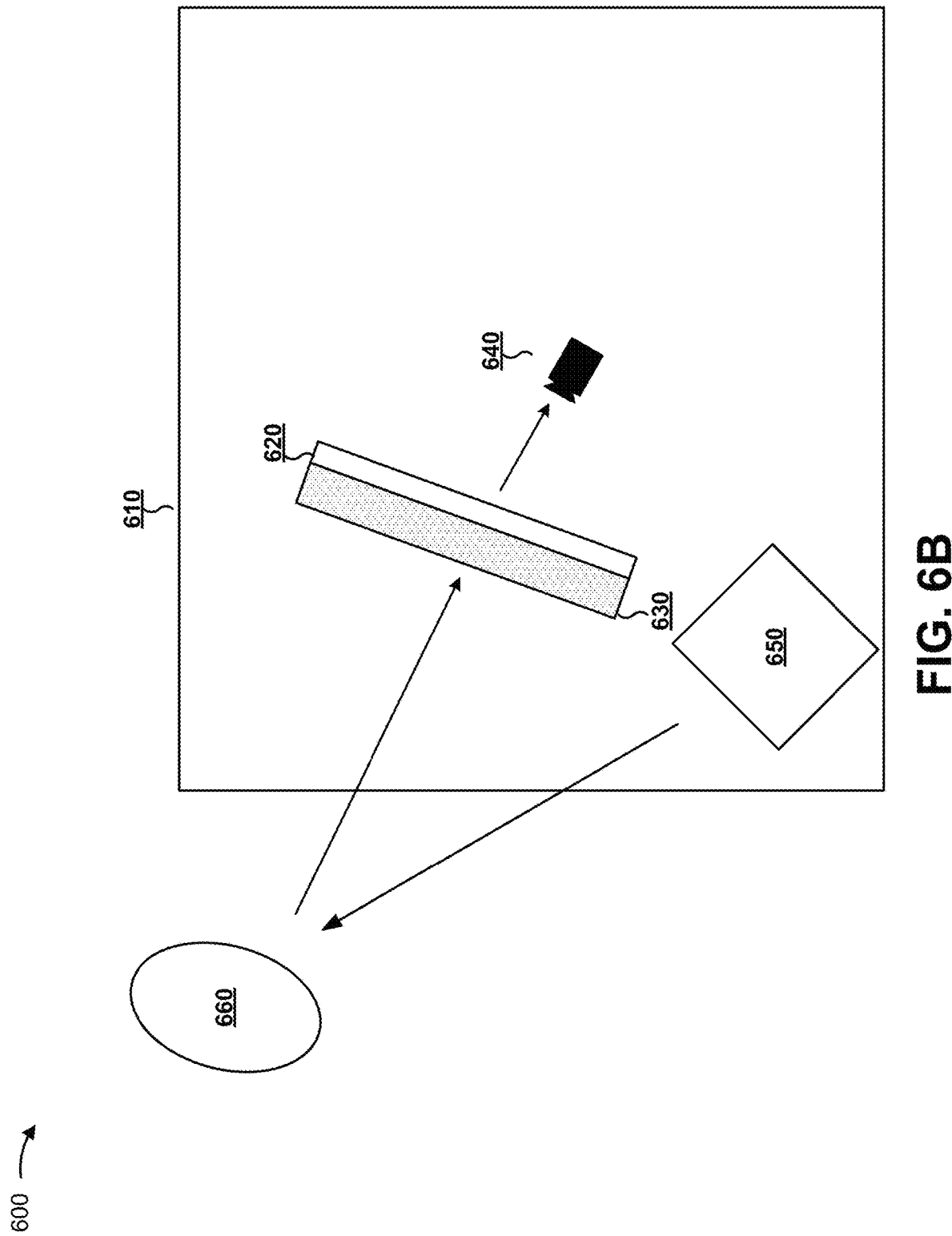

FIGS. 6A and 6B are a diagrams of an example implementation 600 described herein. As shown in FIG. 6A, example implementation 600 includes a sensor system 610. Sensor system 610 may be a portion of an optical system, and may provide an electrical output corresponding to a sensor determination. Sensor system 610 includes an optical filter structure 620, which includes an optical filter 630, and an optical sensor 640. For example, optical filter structure 620 may include an optical filter 630 that performs a passband filtering functionality or another type of optical filter. Sensor system 610 includes an optical transmitter 650 that transmits an optical signal toward a target 660 (e.g., a person, an object, etc.).

Although implementations, described herein, may be described in terms of an optical filter in a sensor system, implementations described herein may be used in another type of system, may be used external to the sensor system, or the like. In some implementations, optical filter 630 may perform a polarization beam splitting functionality for the light. For example, optical filter 630 may reflect a first portion of the light with a first polarization and may pass through a second portion of the light with a second polarization when the second polarization is desired to be received by the optical sensor 640, as described herein. Additionally, or alternatively, optical filter 630 may perform a reverse polarization beam splitting functionality (e.g., beam combining) for the light.

As further shown in FIG. 6A, and by reference number 670, an input optical signal is directed toward optical filter structure 620. The input optical signal may include NIR light emitted by optical transmitter 650 and ambient light from the environment in which sensor system 610 is being utilized. For example, when optical filter 630 is a bandpass filter, optical transmitter 650 may direct near infrared (NIR) light toward a user for a gesture recognition system (e.g., of a gesture performed by target 660), and the NIR light may be reflected off target 660 (e.g., a user) toward optical sensor 640 to permit optical sensor 640 to perform a measurement of the NIR light. In this case, ambient light may be directed toward optical sensor 640 from one or more ambient light sources (e.g., a light bulb or the sun). In another example, multiple light beams may be directed toward target 660 and a subset of the multiple light beams may be reflected toward optical filter structure 620, which may be disposed at a tilt angle relative to optical sensor 640, as shown. In some implementations, another tilt angle may be used (e.g., a 0 degree tilt angle for a bandpass filter). In some implementations, optical filter structure 620 may be disposed and/or formed directly onto optical sensor 640, rather than being disposed a distance from optical sensor 640. For example, optical filter structure 620 may be coated and patterned onto optical sensor 640 using, for example, photolithography. In another example, optical transmitter 650 may direct NIR light toward another type of target 660, such as for detecting objects in proximity to a vehicle, detecting objects in proximity to a blind person, detecting a proximity to an object (e.g., using a LIDAR technique), or the like, and the NIR light and ambient light may be directed toward optical sensor 640 as a result.

As further shown in FIG. 6A, and by reference number 680, a portion of the optical signal is passed by optical filter 630 and optical filter structure 620. For example, alternating silicon-germanium layers (e.g., a high index material) and another type of material layers (e.g., a low index material, such as silicon dioxide ($SiO_2$)) of optical filter 630 may cause the first polarization of light to be reflected in a first direction. In another example, the high index material may include another silicon-germanium based material, such as hydrogenated silicon-germanium, annealed silicon-germanium, or the like as described herein. In this case, optical filter 630 blocks visible light of the input optical signal without excessively blocking NIR light and without introducing an excessive angle-shift with an increase in an angle of incidence of the input optical signal.

As further shown in FIG. 6A, and by reference number 690, based on the portion of the optical signal being passed to optical sensor 640, optical sensor 640 may provide an output electrical signal for sensor system 610, such as for use in recognizing a gesture of the user or detecting the presence of an object. In some implementations, another arrangement of optical filter 630 and optical sensor 640 may be utilized. For example, rather than passing the second portion of the optical signal collinearly with the input optical signal, optical filter 630 may direct the second portion of the optical signal in another direction toward a differently located optical sensor 640. In another example, optical sensor 640 may be an avalanche photodiode, an Indium-Gallium-Arsenide (InGaAs) detector, an infrared detector, or the like.

As shown in FIG. 6B, a similar example implementation 600 may include sensor system 610, optical filter structure 620, optical filter 630, optical sensor 640, optical transmitter 650, and target 660. FIG. 6B shows a particular example implementation 600 that includes an optical filter 630 as described herein.

Optical transmitter 650 emits light at an emission wavelength in a wavelength range of 800 nm to 1100 nm. Optical transmitter 650 emits modulated light (e.g., light pulses). Optical transmitter 650 may be a light-emitting diode (LED), an LED array, a laser diode, or a laser diode array. Optical transmitter 650 emits light towards target 660, which reflects the emitted light back towards sensor system 610. When sensor system 610 is a gesture-recognition system, target 660 is a user of the gesture-recognition system.

Optical filter 630 is disposed to receive the emitted light after reflection by target 660. Optical filter 630 has a passband including the emission wavelength and at least partially overlapping with the wavelength range of 800 nm to 1100 nm. Optical filter 630 is a bandpass filter, such as a narrow bandpass filter. Optical filter 630 transmits the emitted light from the optical transmitter 650, while substantially blocking ambient light.

Optical sensor 640 is disposed to receive the emitted light after transmission by optical filter 630. In some implementations, optical filter 630 is formed directly on optical sensor 640. For example, optical filter 630 may be coated and patterned (e.g., by photolithography) on sensors (e.g., proximity sensors) in wafer level processing (WLP).

When sensor system 610 is a proximity sensor system, optical sensor 640 is a proximity sensor, which detects the emitted light to sense a proximity of target 660. When sensor system 610 is a 3D-imaging system or a gesture-recognition system, optical sensor 640 is a 3D image sensor (e.g., a charge-coupled device (CCD) chip or a complementary metal oxide semiconductor (CMOS) chip), which detects the emitted light to provide a 3D image of target 660, which, for example, is the user. The 3D image sensor converts the optical information into an electrical signal for processing by a processing system (e.g., an application-specific integrated circuit (ASIC) chip or a digital signal processor (DSP) chip). For example, when sensor system 610 is a gesture-recognition system, the processing system processes the 3D image of the user to recognize a gesture of the user.

As indicated above, FIGS. 6A and 6B are provided merely as an example. Other examples are possible and may differ from what was described with regard to FIGS. 6A and 6B.

In this way, a set of silicon-germanium based layers may be used as a high index material for an optical filter coating of an optical filter to provide out-of-band blocking of visible light, transmission of NIR light, and/or filtering of light with a reduced angle shift relative to another type of material used for a set of high index layers. Moreover, based on using hydrogenated silicon-germanium and/or an annealing procedure, out-of-band blocking and in-band transmission are improved relative to another type of material.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical filter comprising:
   an optical filtering coating portion,
   the optical filtering coating portion including:
   a first set of layers that are high refractive index material layers (H), and
   a second set of layers that are low refractive index material layers (L),
   the first set of layers including one or more of silicon-germanium or hydrogenated silicon-germanium, and
   at least some of the first set of layers and at least some of the second set of layers being arranged in one of:
   an $(H\text{-}L)_m$ order,
   an $(H\text{-}L)_m\text{-}H$ order, or
   an $L\text{-}(H\text{-}L)_m$ order,
   where m is a quantity of alternating H and L layers;
   and
   a substrate.

2. The optical filter of claim 1, wherein the quantity of alternating H and L layers is a range of 2 layers to 200 layers.

3. An optical filter, comprising:
   a first set of layers that are high refractive index material layers (H), and
   a second set of layers that are low refractive index material layers (L),
   wherein the first set of layers include one or more of phosphorous, boron, or nitride, and
   wherein at least some of the first set of layers and at least some of the second set of layers being arranged in one of:
   an $(H\text{-}L)_m$ order,
   where m is a quantity of alternating H and L layers.

4. The optical filter of claim 1, wherein the second set of layers include silicon dioxide layer.

5. The optical filter of claim 1, wherein the first set of layers is associated with a thickness of between 1 nanometer (nm) and 1500 nm.

6. The optical filter of claim 3, wherein the first set of layers is associated with a thickness of between 1 nanometer (nm) and 1000 nm.

7. The optical filter of claim 1, wherein the first set of layers is associated with a thickness of between 600 nm and 1000 nm.

8. The optical filter of claim 1, wherein the first set of layers is associated with a thickness of between 10 nm and 500 nm.

9. The optical filter of claim 1, wherein the first set of layers and the second set of layers are arranged in the $L\text{-}(H\text{-}L)_m$ order.

10. The optical filter of claim 1, wherein the optical filtering coating portion is associated with a thickness of between 0.1 µm and 100 µm.

11. The optical filter of claim 1,
    wherein the first set of layers is associated with a first thickness, and
    wherein the second set of layers is associated with a second thickness.

12. The optical filter of claim 1,
    wherein the first set of layers includes a first subset of layers and a second subset of layers,
    wherein the first subset of layers is associated with a first thickness, and
    wherein the second subset of layers is associated with a second thickness.

13. An optical filter comprising:
    a first set of layers associated with a first refractive index,
    wherein the first set of layers comprise a silicon-germanium based material, and
    a second set of layers associated with a second refractive index,
    where the first refractive index is greater than 3 at a spectral range of approximately 800 nanometers (nm) to approximately 1100 nm.

14. The optical filter of claim 13, wherein the second refractive index is different from the first refractive index.

15. The optical filter of claim 13, wherein the first set of layers are manufactured using a sputter deposition procedure.

16. The optical filter of claim 13, wherein the first set of layers are manufactured using a hydrogenating procedure.

17. An optical filter comprising:
    a first set of layers associated with a first refractive index, and
    a second set of layers associated with a second refractive index,
    wherein the first set of layers comprise a silicon-germanium based material, and
    wherein the second refractive index is different from the first refractive index.

18. The optical filter of claim 17, wherein the first set of layers further comprise argon.

19. The optical filter of claim 17, wherein the first refractive index is less than the second refractive index.

20. The optical filter of claim 3, wherein the first set of layers further include one or more of silicon-germanium or hydrogenated silicon-germanium.

* * * * *